United States Patent [19]
Yang et al.

[11] Patent Number: 6,071,789
[45] Date of Patent: Jun. 6, 2000

[54] METHOD FOR SIMULTANEOUSLY FABRICATING A DRAM CAPACITOR AND METAL INTERCONNECTIONS

[75] Inventors: Fu-Liang Yang, Tainan; Erik S. Jeng, Hsinchu; Bih-Tiao Lin, Ping Tung; I-Ping Lee, Taouan, all of Taiwan

[73] Assignee: Vanguard International Semiconductor Corporation, Hsinchu, Taiwan

[21] Appl. No.: 09/190,054

[22] Filed: Nov. 10, 1998

[51] Int. Cl.$^7$ .................................................... H01L 21/20
[52] U.S. Cl. ............................ 438/396; 438/256; 438/399
[58] Field of Search .................................... 438/255, 256, 438/253, 254, 396, 397, 398, 399

[56] References Cited

U.S. PATENT DOCUMENTS

| | | | |
|---|---|---|---|
| 5,336,632 | 8/1994 | Imamura | 438/396 |
| 5,674,771 | 10/1997 | Machida et al. | 438/624 |
| 5,792,681 | 8/1998 | Chang et al. | 438/210 |
| 5,879,981 | 3/1999 | Tanigawa | 438/396 |

*Primary Examiner*—Tuan H. Nguyen
*Attorney, Agent, or Firm*—Christensen O'Connor Johnson & Kindness PLLC

[57] ABSTRACT

A method for simultaneously forming a storage node and a plurality of interconnection in fabricating a semiconductor device on a substrate. The method comprises the steps of: forming a first dielectric layer over said cell array area and said periphery; forming a plurality of first contact holes through said first dielectric layer in said cell array area and said periphery area, said periphery area including a bitline and a word line, said word line and said bitline being used for addressing said memory cell; forming a first conductive layer in said plurality of first contact holes and on said first dielectric layer; patterning and etching said first conductive layer to form said storage node and said plurality of interconnections simultaneously; forming a second dielectric layer and a second conductive layer subsequently on said first dielectric layer, said storage node and said plurality of interconnections; and patterning and etching said second dielectric layer and said second conductive layer to form a charge storage means and a plurality of contact plugs.

19 Claims, 10 Drawing Sheets

METHOD FOR SIMULTANEOUSLY FABRICATING A DRAM CAPACITOR AND METAL INTERCONNECTIONS

TECHNICAL FIELD OF THE INVENTION

This invention relates to a method for fabricating a DRAM cell, and more particularly, relates to a method for fabricating a DRAM cell and simultaneously forming metal interconnection.

BACKGROUND OF THE INVENTION

For high density DRAMs, such as in the 1 GB DRAM and larger, the storage node contact and metal contact cell (SSMC) is formed simultaneously. To fabricate such a prior art DRAM cell in a semiconductor wafer, as seen in FIG. 1, a 0.2–0.4 μm depth shallow trench isolation (STI) 100, a $TiSi_2$ gate 102 and $WSi_2$ bitline 104 are sequentially formed. The $O_3$ TEOS based first interlayer oxide 106 is deposited and planarized by a chemical mechanical polish (CMP) process.

Turning to FIG. 2, the next step is to form contacts simultaneously in both the cell array and the periphery area of the semiconductor wafer. The storage node contacts 108, the metal contacts 110, and the tungsten interconnection 112 are simultaneously formed by depositing a tungsten layer followed by an etching step. Subsequently, a second $O_3$ TEOS based interlayer oxide 114 is deposited, on the semiconductor wafer. The interlayer oxide 114 atop the cell array is removed.

Referring to FIG. 3, a plurality of TiN layers 116 are formed on the plurality of storage node contacts 108. The next step is to form the storage node of the memory cell, i.e., the first conductive layer of the capacitor. Thus, the storage node 118 is formed followed by the deposition of a dielectric layer 120 of the capacitor. A TiN glue layer 122 is then formed by CVD. The glue layer 122 aids in the adherence of a second conductive layer 122. The second conductive layer 122 is a polysilicon layer formed on the cell array. Next, a plate polysilicon layer 126 is formed.

Next, referring to FIG. 4, a first silicon dioxide layer 140 is formed on the semiconductor wafer followed by the formation of a triple level metallization. The cell array silicon dioxide layer 140a above the cell array is higher than the periphery silicon dioxide layer 140b above the periphery area. Therefore, even if the first metal interconnection 142 is already formed electrically coupled to the tungsten interconnection 112, it is necessary to form a second metal interconnection 144 electrically coupled to the first metal interconnection 142. To reduce the step height between the periphery area and the cell array, it is necessary to deposit a second silicon dioxide layer 146. Then, the second metal interconnection 144 is formed on the second silicon dioxide layer 146. Because a triple level metallization is used in the semiconductor DRAM of the prior art, the topography of the semiconductor wafer is conformal.

This prior art technique has several disadvantages. Because the process of triple level metallization is essential, it is necessary to use additional masks to form the contacts of the first metal interconnection 142 and the second metal interconnection 144. Further, the alignment process when forming the first metal interconnection 142 and the second metal interconnection 144 can be difficult. Moreover, when the step height of the topography between the periphery area and the cell array is large, it is difficult to maintain the conformity of the semiconductor wafer even though the second silicon dioxide layer 146 is used.

SUMMARY OF THE INVENTION

A method for simultaneously forming a capacitor storage node and a plurality of interconnections in fabricating a memory cell on a substrate, said substrate comprising a cell array area and a periphery area. The method comprises the steps of: forming a first dielectric layer over said cell array area and said periphery; forming a plurality of first contact holes through said first dielectric layer in said cell array area and said periphery area, said periphery area including a bitline and a word line, said word line and said bitline being used for addressing said memory cell; forming a first conductive layer in said plurality of first contact holes and on said first dielectric layer; patterning and etching said first conductive layer to form said storage node and said plurality of interconnections simultaneously; forming a second dielectric layer and a second conductive layer subsequently on said first dielectric layer, said storage node and said plurality of interconnections; and patterning and etching said second dielectric layer and said second conductive layer to form a charge storage means and a plurality of contact plugs.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1:
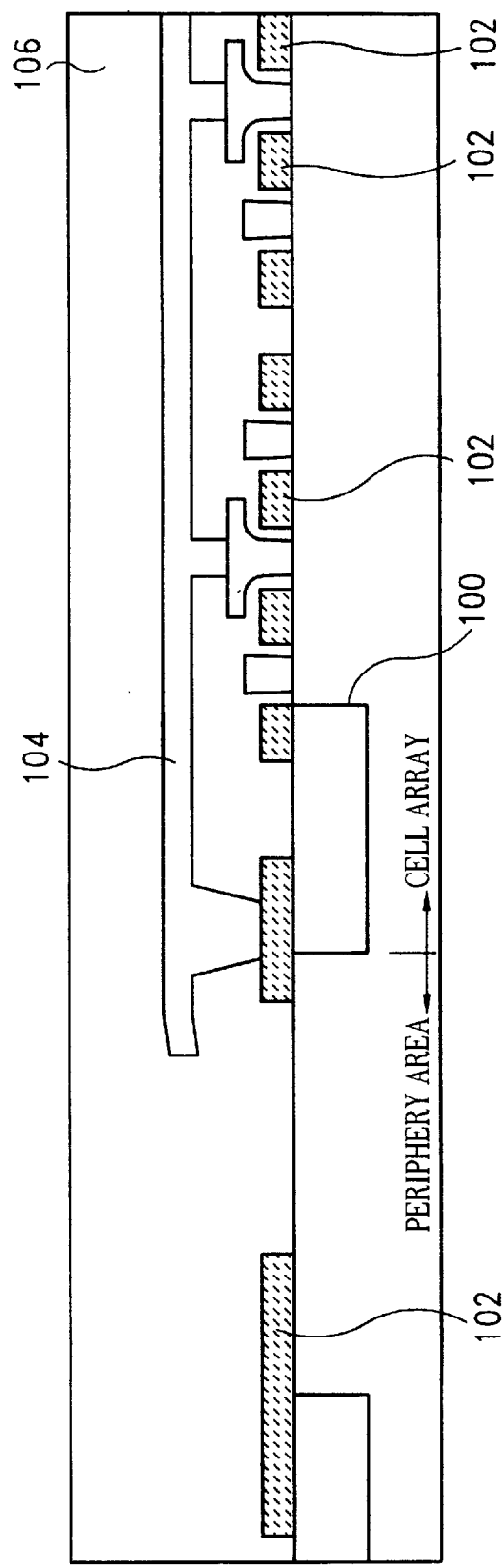
FIGS. 1–4 shows cross sectional views of a DRAM structure during the steps of manufacture according to the prior art.
Figure 2:
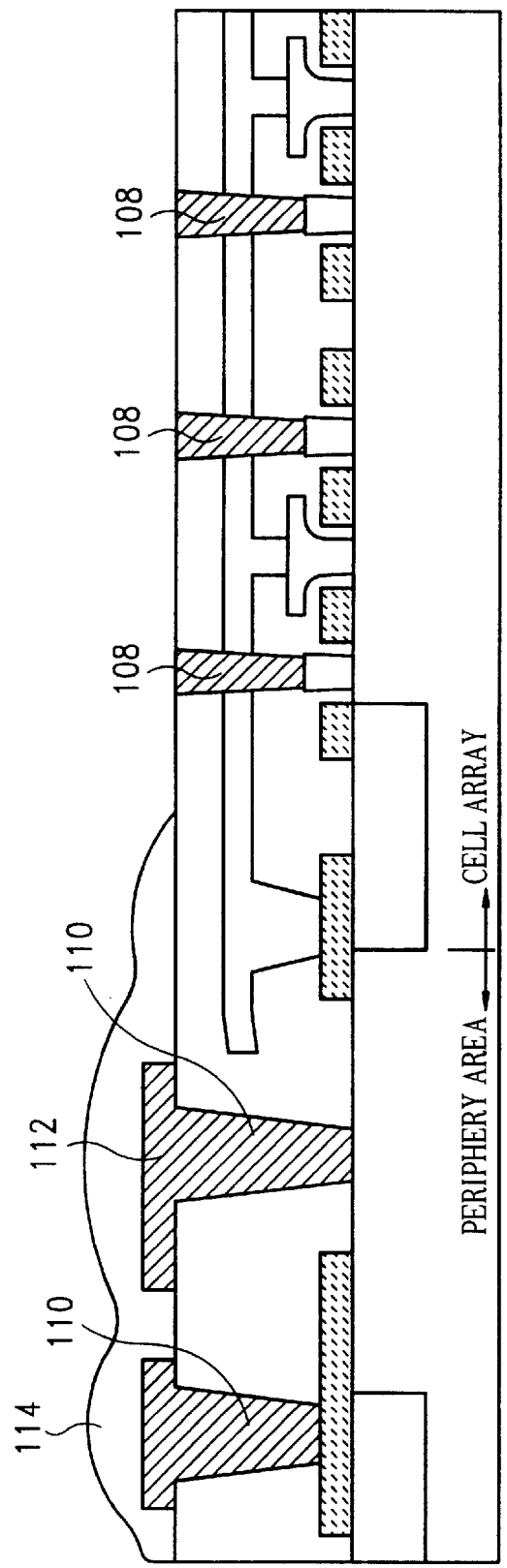
Figure 3:
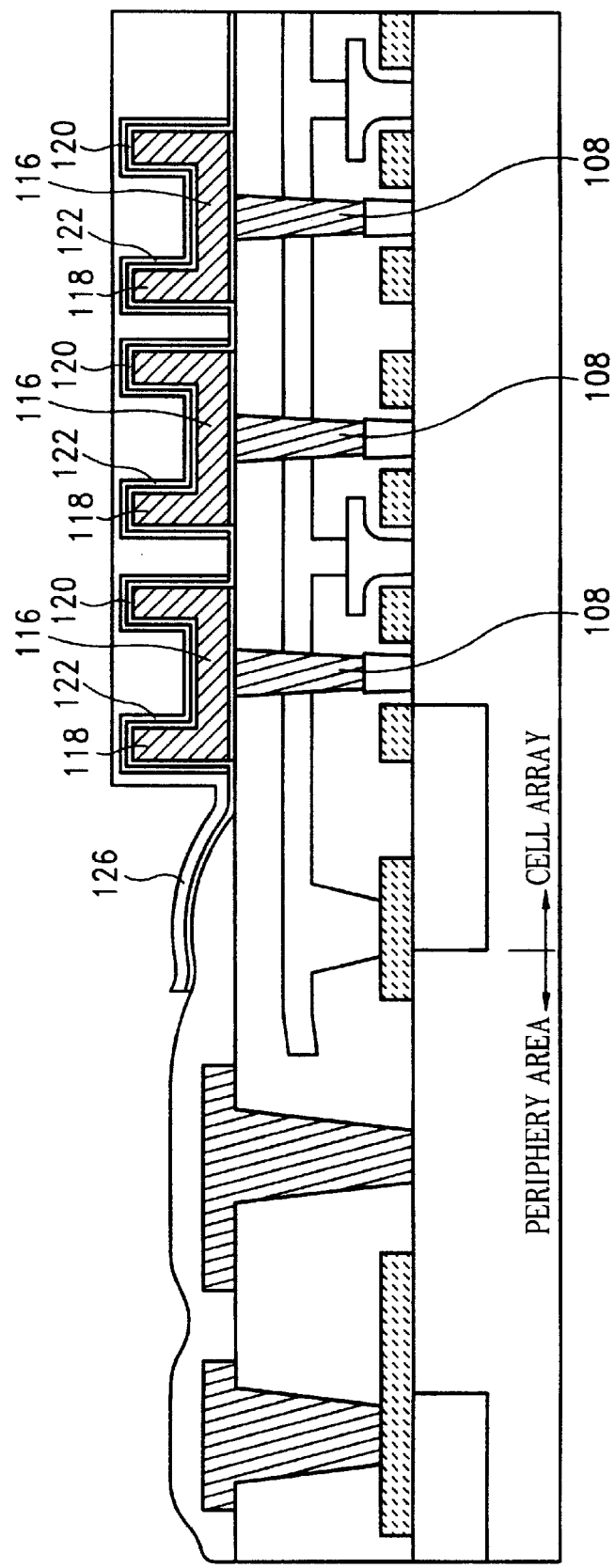
Figure 4:
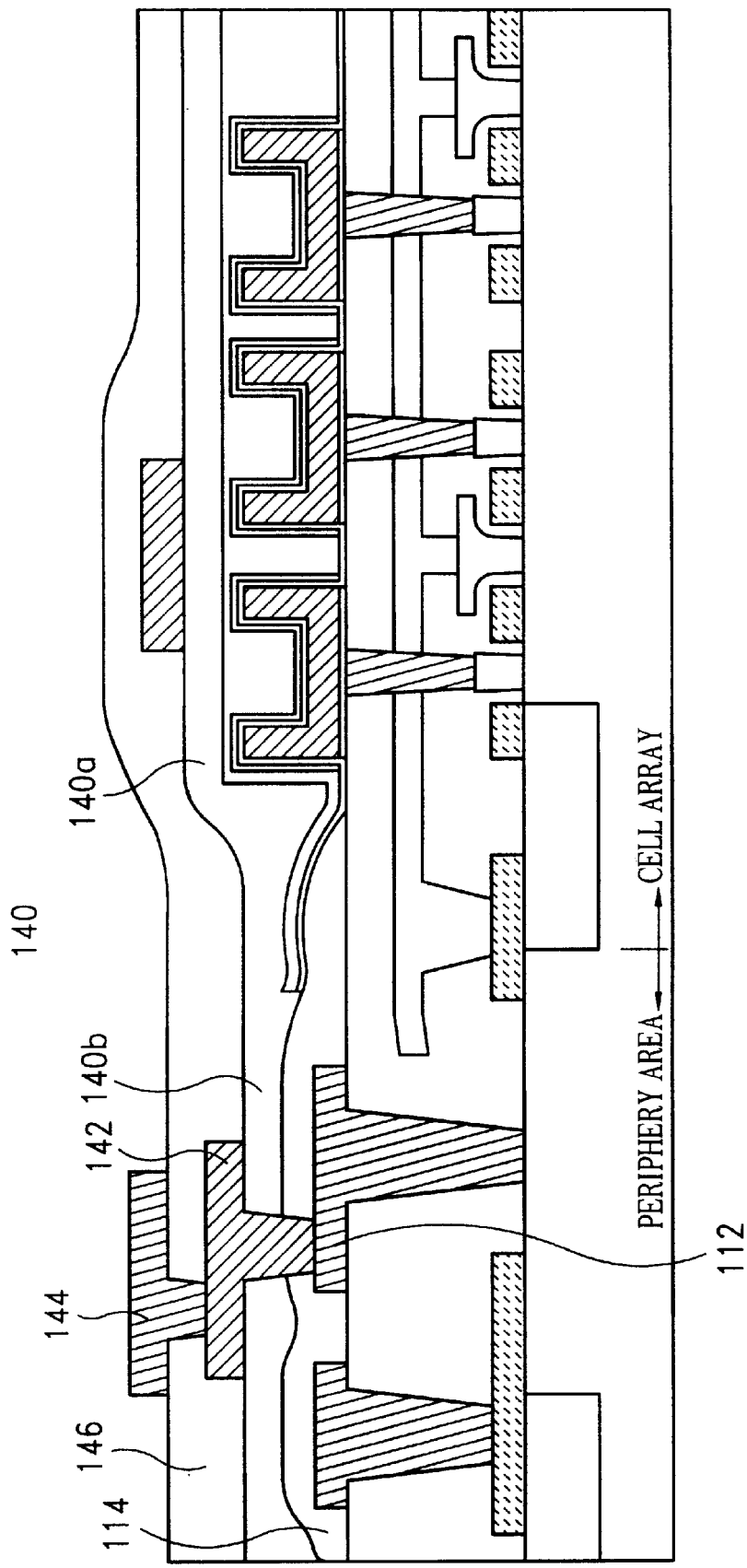
Figure 5:
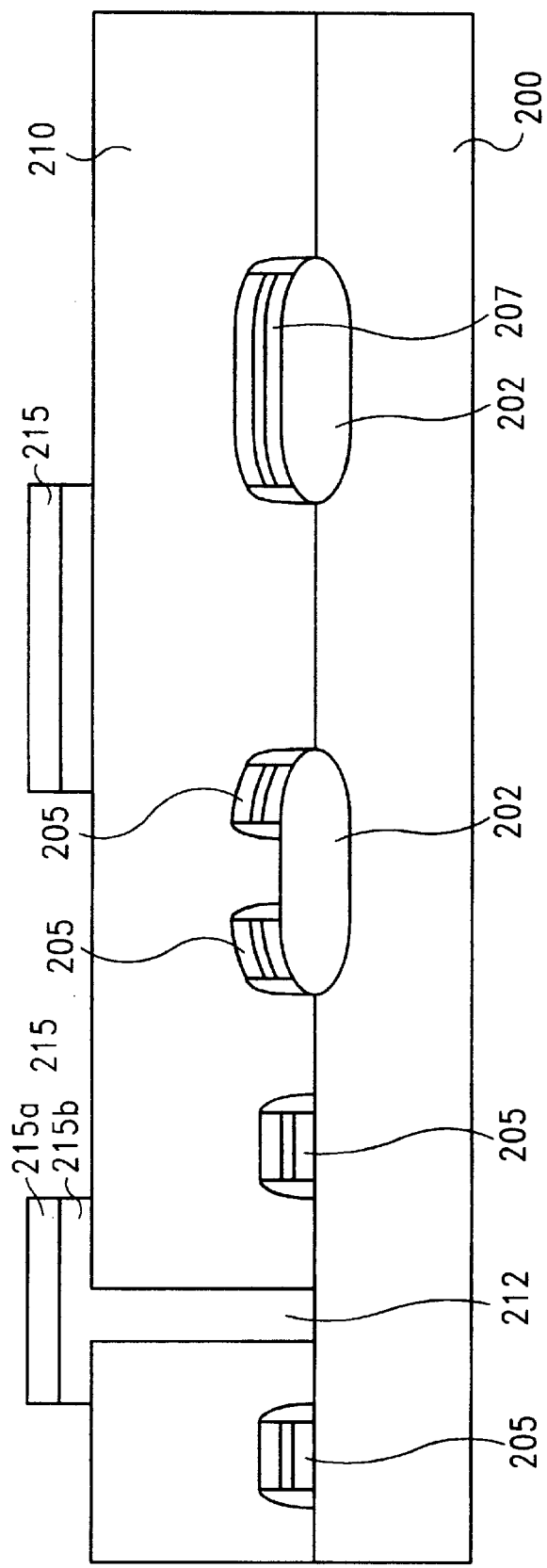
FIGS. 5–10 shows cross sectional views of a DRAM structure formed in accordance with the present invention.

Referring to FIG. 5, a substrate 200 is provided. Field oxide (FOX) 202 regions are formed in the substrate 200. The FOX 202 is preferably formed from shallow trench isolations. Next, conventional processes are used to form gate structures 205 and a word line 207 for the DRAM cell.

Next, a first dielectric layer 210 is deposited over the entire structure and a contact 212 is formed in the first dielectric layer 210. The contact is formed by etching a contact hole in the first dielectric layer 210 and filling the contact hole with a conducting material, such as polysilicon. The first dielectric layer 210 can be an $O_3$ TEOS based interlayer oxide or BPSG (borophosphosilicate glass). Subsequently, a bitline 215 is formed on the first dielectric layer 210. The contact 212 and the bitline 215 are formed conventional prior art methods. For example, the bitline 215 in the preferred embodiment includes a tungsten silicide portion 215a and polysilicon portion 215b.

Figure 6:
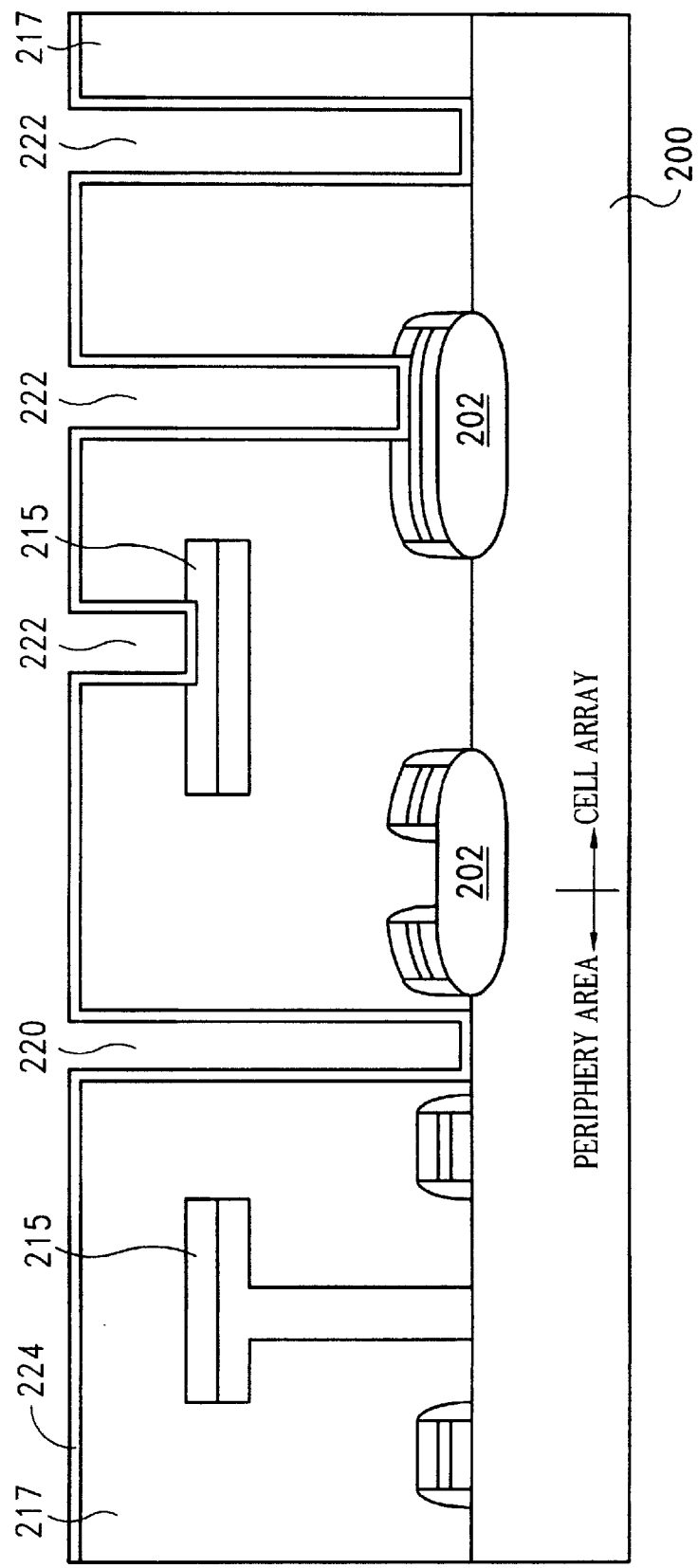

Referring to FIG. 6, a second dielectric layer 217 is next formed to act as an interlayer dielectric. The material used to form the second dielectric layer 217 is an $O_3$ TEOS based interlayer oxide or BPSG in this preferred embodiment. To obtain a global planarized surface of the interlayer dioxide, a CMP step is performed. Following the CMP process, a storage node contact hole 220 and a metal contact hole 222 are simultaneously formed by etching the planarized second dielectric layer 217. Next, a tungsten barrier layer 224 is formed on the surface of the etched planarized second dielectric layer 217.

Figure 7:
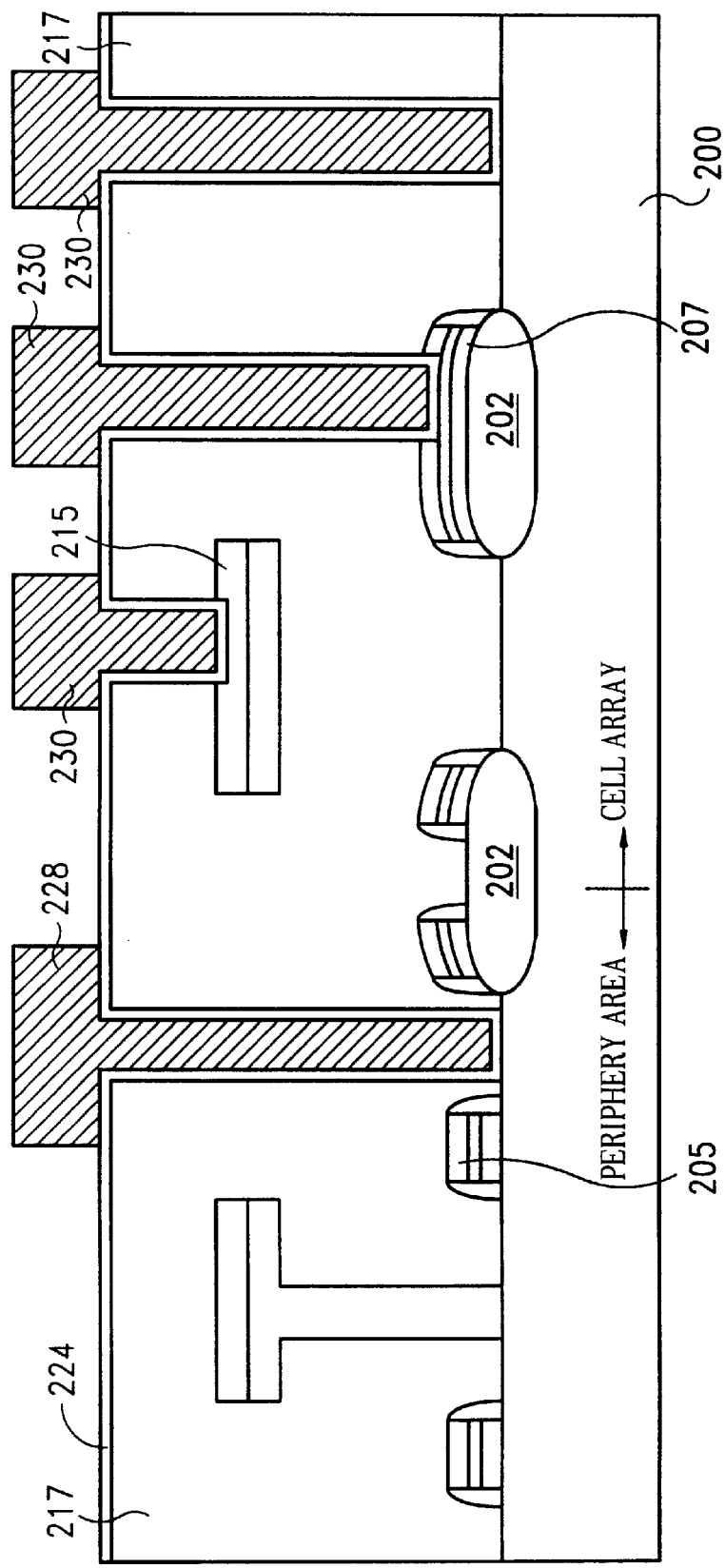

Referring to FIG. 7, a tungsten film is formed on the tungsten barrier layer 224, i.e., a tungsten film is formed on the entire surface of the topography of the semiconductor wafer. Subsequently, a tungsten capacitor storage node 228 and a plurality of tungsten local interconnections 230 are simultaneously patterned by a traditional tungsten etching step. The plurality of tungsten local interconnections 230 are electrically coupled to the bitline 215, the wordline 207 and the substrate 200 in the periphery area, respectively. In addition, the tungsten capacitor storage node 228 is electrically coupled to the source/drain electrode (not shown) of a MOSFET that is controlled by the gate 205 in the cell array. The tungsten capacitor storage node 228 is basically the first conductive layer of the capacitor of the DRAM cell.

Figure 8:
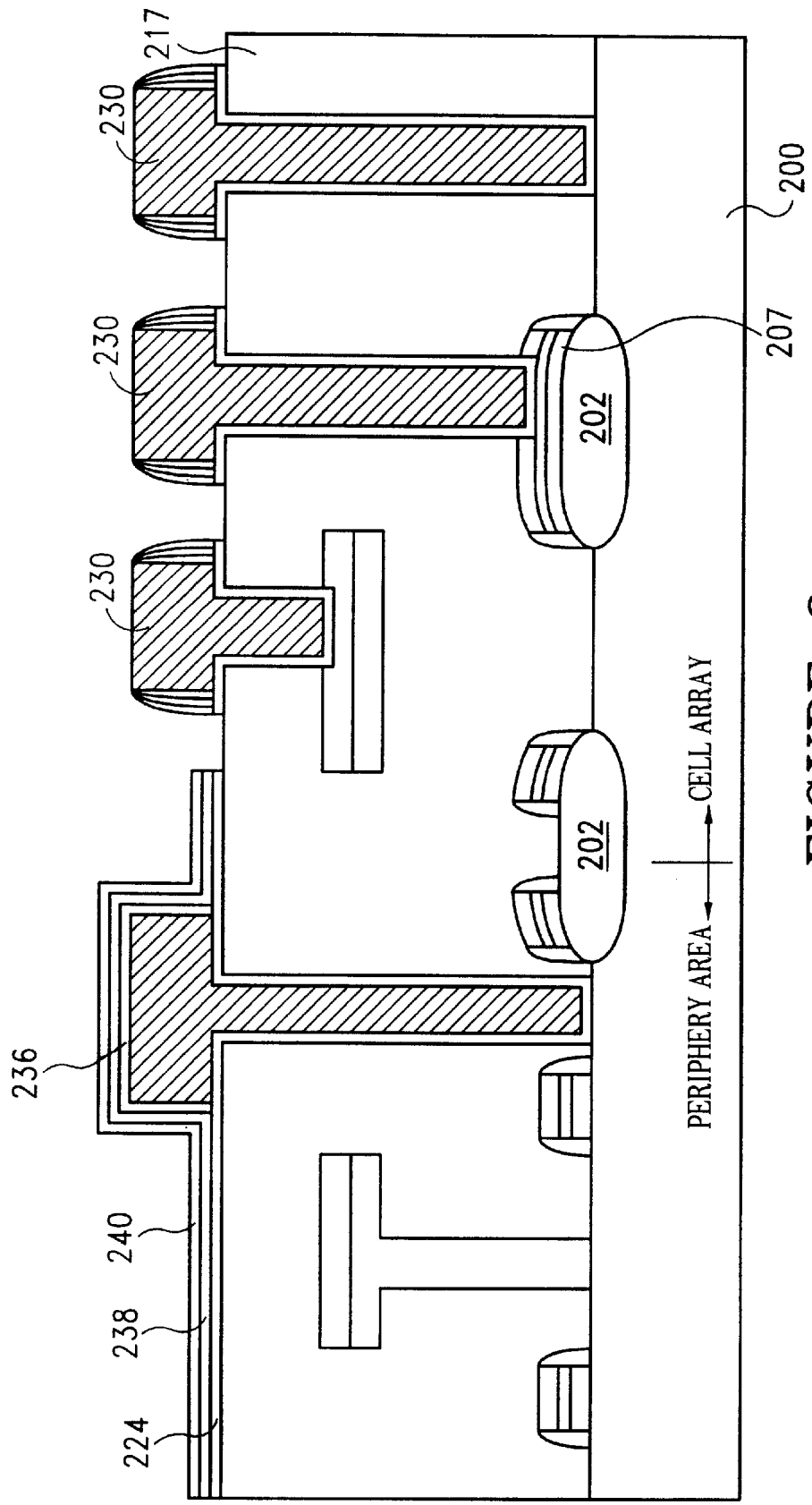

Note that there is no step height between the topography of the cell array and that of the periphery area. To form a cell capacitor of the DRAM cell, a dielectric layer and a second conductive layer of the capacitor are formed utilizing a traditional process. Referring to FIG. 8, a dielectric layer 236, a first TiN glue layer 238 and a polysilicon layer 240 are subsequently formed and patterned on the cell array of the DRAM cell. The polysilicon layer 240 is the plate polysilicon of the DRAM cell. Thus, the dielectric layer and the second conductive layer of the capacitor are formed on the cell array.

The material that used to fabricate the dielectric layer 236 can be $Ta_2O_5$, BST, or PZT. In addition, the material that used to fabricate the second conductive layer can be replaced by a doped polysilicon, Al, W, or Ta.

The polysilicon layer 240 can be formed of doped polysilicon.

Figure 9:
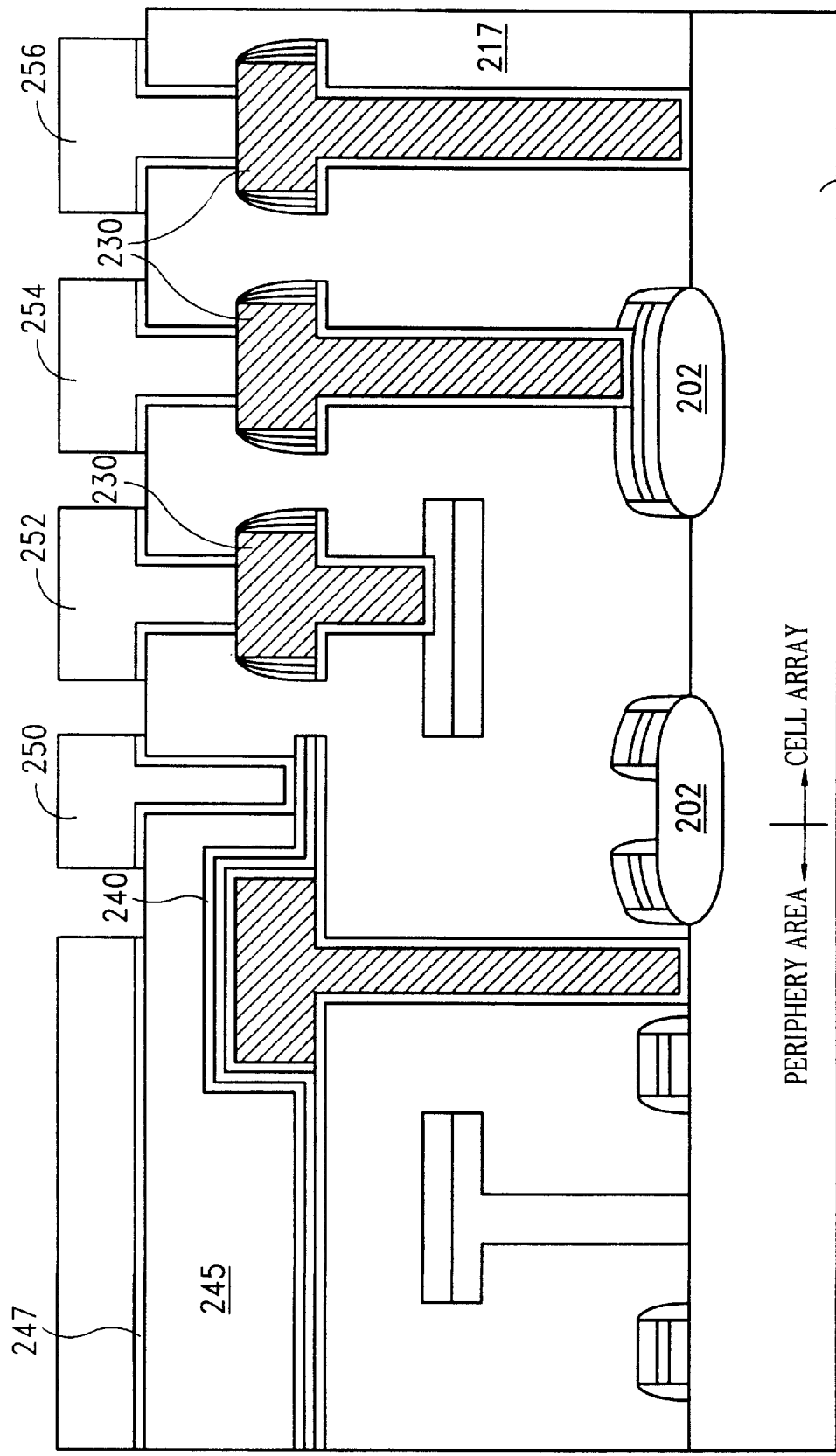

Next, turning to FIG. 9, a first intermediate dielectric (IID) layer 245 is formed on the polysilicon layer 240, the etched planarized second dielectric layer 217, and the plurality of tungsten local interconnections 230. An $O_3$ TEOS based interlayer oxide or the BPSG both can be used to form the first IMD layer 245 in this preferred embodiment. The first IMD layer 245 is then etched by a traditional method, followed by a deposition of a second TiN glue layer 247 on the first IMD layer 245.

Subsequently, a first aluminum layer is formed on the second TiN glue layer 247 followed by etching the first aluminum layer and the second TiN glue layer 247. Thus, a first via plug 250 is electrically coupled to the plate polysilicon. In addition, a second via plug 252 is electrically coupled to the tungsten local interconnection 230 that is in turn coupled to the bitline 215. A third via plug 254 is electrically coupled to the tungsten local interconnection 230 that in turn is coupled to the word line 202. Finally, a fourth via plug 256 is electrically coupled to the tungsten local interconnection 230 that is coupled to the substrate 200. As noted, the height of the first via plug 250 and the second via plug 252 is equal to the via plug on the cell array, i.e., there is no step height between the via plug on the periphery area and that on the cell array.

Figure 10:
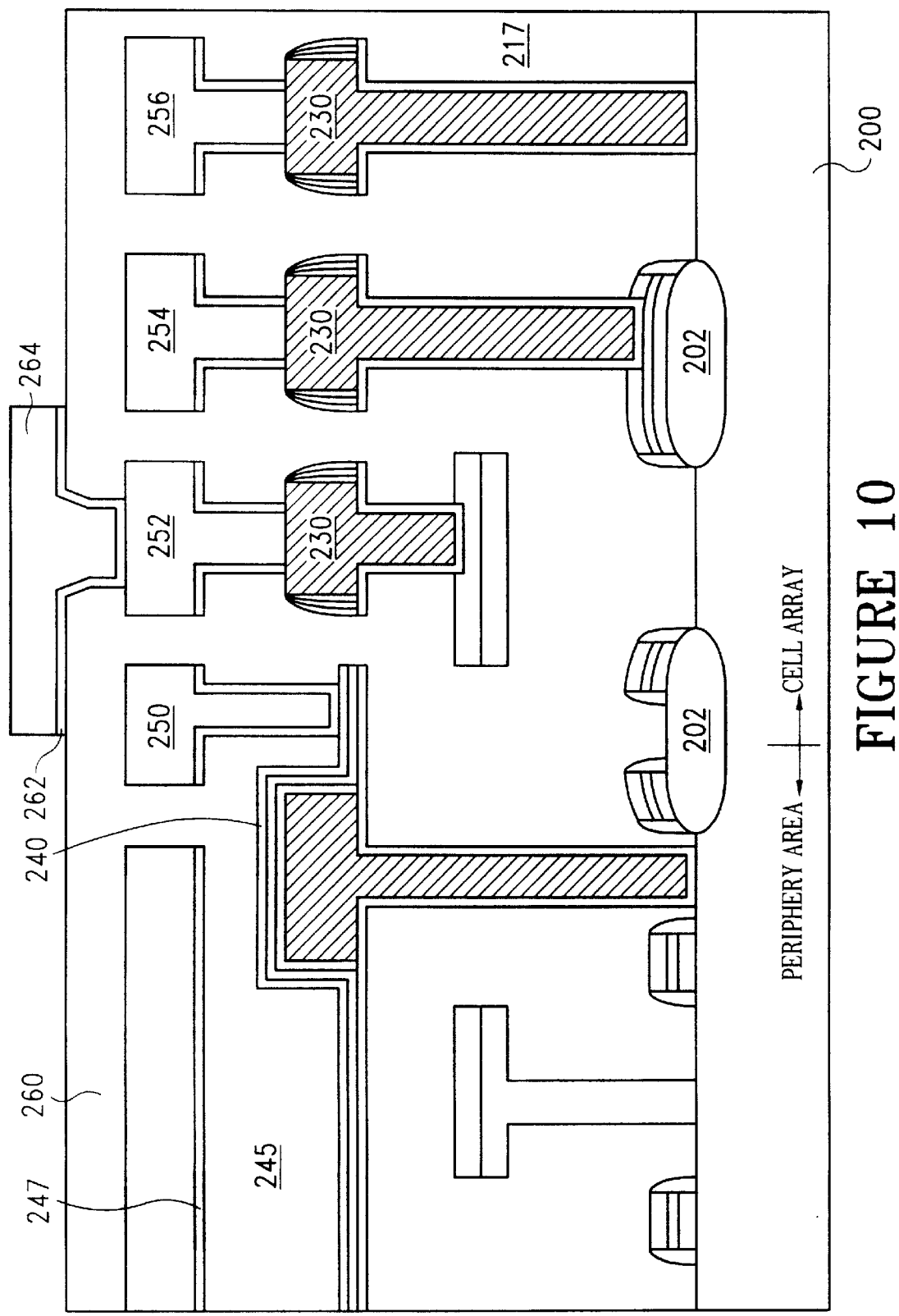

Referring to FIG. 10, a second IMD layer 260 is formed on the plurality of via plugs and the first IMD layer 245. In this preferred embodiment, the second IMD layer 260 can be formed of $O_3$ TEOS based interlayer oxide or BPSG. Next, the second IMD layer 260 is etched by a traditional method to form a contact hole as shown. This is followed by the deposition of a third TiN glue layer 262 on the second IMD layer 260.

Then, a second aluminum layer is formed on the third TiN glue layer 262 followed by the etching of the second aluminum layer and the third TiN glue layer 262 to form a fifth via plug 264. The fifth via plug 264 is electrically coupled to the second via 252 to form the conducting line of the memory cell.

Although specific embodiments have been illustrated and described it will be obvious to those skilled in the art that various modifications may be made without departing from the spirit which is intended to be limited solely by the appended claims.

What is claimed is:

1. A method for simultaneously forming a capacitor storage node and a plurality of interconnections in fabricating a memory cell on a substrate, said substrate comprising a cell array area and a periphery area, said method comprising:

forming a first dielectric layer over said cell array area and said periphery;

planarizing said first dielectric layer;

simultaneously forming a plurality of first contact holes through said first dielectric layer in said cell array area and said periphery area, said periphery area including a bitline and a word line, said word line and said bitline being used for addressing said memory cell, wherein a storage node contact hole of said plurality of first contact holes has a depth different from that of an interconnection contact hole of said plurality of first contact holes;

forming a first conductive layer in said plurality of first contact holes and on said first dielectric layer;

patterning and etching said first conductive layer to form said storage node and said plurality of interconnections simultaneously;

forming a second dielectric layer and a second conductive layer subsequently on said first dielectric layer, said storage node and said plurality of interconnections; and patterning and etching said second dielectric layer and said second conductive layer to form a charge storage means in said cell array area and a plurality of contact plugs in said periphery area.

2. The method of claim 1, further comprising:

forming a third dielectric layer on said second conductive layer, said storage means and said plurality of contact plugs;

etching said third dielectric layer to form a plurality of second contact holes exposing said second conductive layer and said plurality of contact plugs;

forming a third conductive layer in said plurality of second contact holes and oil said third dielectric layer;

patterning and etching said third conductive layer to form a first via plug, a second via plug, a third via plug and a fourth via plug, said first via plug being electrically coupled to said second conductive layer, said second via plug being electrically coupled to said bitline, said third via plug being electrically coupled to said word line, said fourth via plug being electrically coupled to said substrate;

forming a fourth dielectric layer on said third conductive layer, said third dielectric layer, said first via plug, said second via plug, said third via plug, and said fourth via plug;

patterning and etching said fourth dielectric layer to form a third contact hole exposing said second via plug;

forming a fourth conductive layer on said fourth dielectric layer and in said third contact hole; and patterning said fourth conductive layer to form a conducting line of said memory cell, said conducting line being electrically coupled to said bitline.

3. The method of claim 1, wherein said plurality of contact plugs comprise a first contact plug, a second contact plug, and a third contact plug, said first contact plug being electrically coupled to said bitline, said second contact plug being electrically coupled to said word line, said third contact plug being electrically coupled to said substrate of said periphery area.

4. The method of claim 1, wherein said first conductive layer is formed of a group consisting of: doped poly silicon, Al, W, and Ta.

5. The method of claim 1, wherein said second dielectric layer is formed of a group consisting of: $Ta_2O_5$, BST, and PZT.

6. The method of claim 1, wherein said second conductive layer is formed of a group consisting of: doped poly silicon, Al, W, and Ta.

7. The method of claim 1, wherein said first dielectric layer, said third dielectric layer and said fourth dielectric layer are formed of a group consisting of: an $O_3$ TEOS based interlayer oxide or BPSG.

8. The method of claim 1, wherein said third conductive layer is formed of aluminum (Al).

9. The method of claim 1, wherein said fourth conductive layer is formed of aluminum (Al).

10. The method of claim 1, wherein said charge storage means is a capacitor.

11. A method for simultaneously forming a storage node and a plurality of interconnection in fabricating a semiconductor device on a substrate, said substrate comprising a cell array and a periphery area, said method comprising:

forming a first dielectric layer over said cell array area and said periphery;

planarizing said first dielectric layer;

simultaneously forming a plurality of first contact holes through said first dielectric layer in said cell array area and said periphery area, said periphery area including a bitline and a word line, said word line and said bitline being used for addressing said memory cell, wherein a storage node contact hole of said plurality of first contact holes has a depth different from that of an interconnect contact hole of said plurality of first contact holes;

forming a first conductive layer in said plurality of first contact holes and on said fist dielectric layer;

patterning and etching said first conductive layer to form said storage node and said plurality of interconnections simultaneously;

forming a second dielectric layer and a second conductive layer subsequently on said first dielectric layer, said storage node and said plurality of interconnections; and patterning said second dielectric layer and said second conductive layer to form a storage means in said cell array area, a first contact plug, a second contact plug, and a third contact plug in said periphery area, said first contact plug being electrically coupled to said bitline, said second contact plug being electrically coupled to said word line, and said third contact plug being electrically coupled to said substrate of said periphery area.

12. The method of claim 11, wherein said method further comprises:

forming a third dielectric layer on said second conductive layer, said storage means, said first contact plug, said second contact plug, and said third contact plug;

patterning and etching said third dielectric layer to form a plurality of second contact exposing said second conductive layer, said first contact plug, said second contact plug and said third contact plug;

forming a third conductive layer in said plurality of second contacts and on said third dielectric layer;

patterning and etching said third conductive layer to form a first via plug, a second via plug, a third via plug and a fourth via plug, said first via plug being electrically coupled to said second conductive layer, said second via plug being electrically coupled to said bitline, said third via plug being electrically coupled to said word line, said fourth via plug being electrically coupled to said substrate;

forming a fourth dielectric layer on said third conductive layer, said third dielectric layer, said first via plug, said second via plug, said third via plug, and said fourth via plug;

etching said fourth dielectric layer to form a third contact hole exposing said second via plug;

forming a fourth conductive layer on said fourth dielectric layer and in said third contact hole; and patterning said fourth conductive layer to form a conducting line of said semiconductor device, said conducting line being electrically coupled to said bit line.

13. The method of claim 11, wherein said first conductive layer is formed of a group consisting of: doped poly silicon, Al, W, and Ta.

14. The method of claim 11, wherein said second dielectric layer is formed of a group consisting of: $Ta_2O_5$ BST, and PZT.

15. The method of claim 11, wherein said second conductive layer is formed of a group consisting of: doped poly silicon, Al, W, and Ta.

16. The method of claim 11, wherein said first dielectric layer, said third dielectric layer and said fourth dielectric layer are formed of a group consisting of: an $O_3$ TEOS based interlayer oxide or BPSG (Borophosphosilicate glass).

17. The method of claim 11, wherein said third conductive layer is formed of aluminum (Al).

18. The method of claim 11, wherein said fourth conductive layer is formed of aluminum (Al).

19. The method of claim 1, wherein said charge storage means is a capacitor.

* * * * *

UNITED STATES PATENT AND TRADEMARK OFFICE
CERTIFICATE OF CORRECTION

PATENT NO. : 6,071,789
DATED : June 6, 2000
INVENTOR(S) : F.-L. Yang et al.

It is certified that error appears in the above-identified patent and that said Letters Patent is hereby corrected as shown below:

| COLUMN | LINE | |
|---|---|---|
| 4 (Claim 2, | 45 line 9) | "oil" should read --on-- |
| 5 (Claim 11, | 42 line 18) | "fist" should read --first-- |
| 6 (Claim 12, | 10 line 7) | "second contact" should read --second contacts-- |
| 6 (Claim 14, | 39 line 1) | "Ta$_2$O$_5$BST," should read --Ta$_2$O$_5$, BST,-- |
| 6 (Claim 19, | 52 line 1) | "claim 1," should read --claim 11,-- |

Signed and Sealed this

First Day of May, 2001

Attest:

NICHOLAS P. GODICI

*Attesting Officer*   *Acting Director of the United States Patent and Trademark Office*